United States Patent [19]

Schellinger, Jr.

[11] 4,401,509

[45] Aug. 30, 1983

[54] COMPOSITION AND PROCESS FOR PRINTED CIRCUIT ETCHING USING A SULFURIC ACID SOLUTION CONTAINING HYDROGEN PEROXIDE

[75] Inventor: Richard Schellinger, Jr., Trenton, N.J.

[73] Assignee: FMC Corporation, Philadelphia, Pa.

[21] Appl. No.: 415,002

[22] Filed: Sep. 7, 1982

[51] Int. Cl.$^3$ .............................................. C23F 1/00
[52] U.S. Cl. ................................. 156/666; 156/901; 252/79.4
[58] Field of Search ............... 156/640, 664, 666, 901, 156/902, 656, 659.1; 252/79.2, 79.4, 142, 151; 423/272; 134/3, 41

[56] References Cited

U.S. PATENT DOCUMENTS

| | | | |
|---|---|---|---|
| 3,122,417 | 2/1964 | Blaser et al. | 23/207.5 |
| 3,234,140 | 2/1966 | Irani | 252/186 |
| 3,269,881 | 8/1966 | Alderuccio et al. | 156/3 |
| 3,293,093 | 12/1966 | Jones et al. | 156/18 |
| 3,314,811 | 4/1967 | Mitchell et al. | 106/286 |
| 3,341,384 | 9/1967 | Alderuccio et al. | 156/18 |
| 3,373,113 | 3/1968 | Achenbach | 252/79.2 |
| 3,383,174 | 5/1968 | Carnine et al. | 23/207.5 |
| 3,407,141 | 10/1968 | Banush et al. | 252/79.4 |
| 3,463,733 | 8/1969 | Achenbach | 252/79.4 |
| 3,537,895 | 11/1970 | Lancy | 134/3 |
| 3,597,290 | 8/1971 | Nalto et al. | 156/18 |
| 3,649,194 | 3/1972 | Glanville | 23/207.5 |
| 3,668,131 | 6/1972 | Banush et al. | 252/79.4 |
| 3,681,022 | 8/1972 | Kibbel et al. | 23/207.5 |
| 3,701,825 | 10/1972 | Radimer et al. | 423/273 |
| 3,773,577 | 11/1973 | Shibasaki et al. | 156/8 |
| 3,781,409 | 12/1973 | Munday et al. | 423/273 |
| 3,801,512 | 4/1974 | Solenberger | 252/186 |
| 3,839,534 | 10/1974 | Matsumoto et al. | 423/43 |
| 3,902,896 | 9/1975 | Borbely et al. | 75/109 |
| 3,903,244 | 9/1975 | Winkley | 423/272 |
| 3,933,982 | 1/1976 | Kushibe | 423/272 |
| 3,945,865 | 3/1976 | Kamperman | 156/18 |
| 3,948,703 | 4/1976 | Kushibe | 156/20 |
| 3,959,436 | 5/1976 | Watts | 423/27 |
| 4,040,863 | 8/1977 | Kitamura | 134/3 |
| 4,130,455 | 12/1978 | Elias et al. | 156/666 |

OTHER PUBLICATIONS

ASTM Handbook Committee, "Metals Handbook", 8th Edition, vols. 2 and 3, American Society for Metals, Metals Park, Ohio, (1964).
Schumb et al, "Hydrogen Peroxide", Reinhold Publishing Corp., New York, New York, (1955).
Kirk-Othmer, "Encyclopedia of Chemical Technology", vol. 13, 3rd Edition, New York, John Wiley & Sons, New York.

*Primary Examiner*—William A. Powell
*Attorney, Agent, or Firm*—Richard E. Elden; Eugene G. Horsky

[57] ABSTRACT

Compositions are provided suitable for the etching of printed circuits from a laminate of copper metal and an etch resistant backing at a low hydrogen peroxide concentration and at a low temperature. The etching composition contains sulfuric acid, hydrogen peroxide as the oxidant, thiosulfate ion to counteract the depressing effect of chloride ion on the etch rate, an unsaturated organic hydroxy compound to stabilize the hydrogen peroxide in the presence of copper, and an aminomethylenephosphonic acid.

7 Claims, No Drawings

COMPOSITION AND PROCESS FOR PRINTED CIRCUIT ETCHING USING A SULFURIC ACID SOLUTION CONTAINING HYDROGEN PEROXIDE

This invention relates to the etching of laminated, printed circuit boards with sulfuric acid containing hydrogen peroxide as the oxidant.

In the manufacture of printed electronic circuits, a laminate of copper and etch-resistant plastic is generally used. The desired pattern is applied to the copper surface of the laminate with a resist material which is impervious to the action of an etch solution. The unprotected areas of the copper are etched away while the masked areas remain intact and provide the desired circuitry supported by the plastic. The resist material can be a plastic material, an ink, or a metal, such as gold, solder, or a tin-nickel alloy.

There has been a recent trend in the industry to replace etchants containing ammonia, chromium salts, ferric chloride, and copper chloride with etchants which have less problems with environmentally-acceptable methods for disposal of the by-products and the effects of accidental spills. Etchants based on sulfuric acid and a peroxygen, such as hydrogen peroxide, have attracted favorable industrial attention because the only residuals, copper and sulfate, can be crystallized as copper sulfate pentahydrate.

Although hydrogen peroxide is unstable thermodynamically, it is not subject to autodecomposition processes when pure. Hydrogen peroxide, however, is subject to decomposition by heterogeneous or homogeneous catalysts. The stabilizer system selected for hydrogen peroxide depends on the quantity and nature of the decomposition catalyst with which the hydrogen peroxide is expected to be contacted. For example, pure, concentrated hydrogen peroxide being stored by the manufacturer in large aluminum tanks needs very little stabilizer; dilute hydrogen peroxide or hydrogen peroxide subject to contamination by uncertain catalysts requires higher concentrations of general-purpose stabilizers; but metal etching formulations containing hydrogen peroxide require stabilizers specific to the metal being etched. The metal being etched may function both as a heterogeneous and as a homogeneous decomposition catalyst.

The majority of hydrogen peroxide stabilization studies have been directed towards the stabilization of commercial hydrogen peroxide in concentrated solution in aluminum containers where the highly concentrated hydrogen peroxide has been diluted with either ordinary tap water or demineralized water containing low levels of possible heavy-metal contaminants, such as 5.0 milligrams per liter of iron and 0.15 milligrams per liter of copper. The presence of chlorides in ordinary tap water for dilution purposes has been of concern primarily because of its tendency to corrode aluminum containers.

However, in the etching of printed circuit boards different problems are encountered. Instead of 0.15 milligrams per liter of copper, as much as 60 grams per liter are usually maintained. This high level of heavy metal impurity requires formulations which differ from the commercial hydrogen peroxide of the prior art.

The combined effect of mixing two different stabilizer systems is rarely additive but may exceed the sum of the effects of the individual stabilizer components, or the stabilizers may cancel each other and result in little or no stabilization effect whatsoever. Further, it is well known that the quantity of stabilizer required decreases with increasing concentration of the hydrogen peroxide. Therefore, the more dilute solutions of hydrogen peroxide in the presence of decomposition catalysts require a higher stabilizer content than commercial hydrogen peroxide solutions.

In addition, Alderuccio et al, in U.S. Pat. No. 3,269,881 disclose that more than 2 milligrams per liter of free chloride or bromide ion adversely affects the etching rates of sulfuric acid printed circuit etchants using hydrogen peroxide as the oxidant. As the typical untreated tap water available in the United States contains from 2 to 300 milligrams per liter of free chloride ion, it was necessary until recently to treat the water used to prepare etching solutions by distillation or by ion exchange to obtain acceptable etch rates. Elias et al, in U.S. Pat. No. 4,130,455, teach that the addition of either sodium thiosulfate or potassium thiosulfate to an aqueous etching bath containing sulfuric acid and hydrogen peroxide will permit satisfactory etch rates in the presence of up to 500 milligrams per liter of free chloride ion.

While the sodium or potassium thiosulfate additive of Elias et al provides a means to overcome the depressing effect on etch rate caused by free chloride or bromide ions, it does not answer the basic problem of the catalytic decomposition of hydrogen peroxide. This decomposition is important for two reasons: firstly, the depletion of the hydrogen peroxide in the etching solution reduces the etch rate; and secondly, the potential of an uncontrolled decomposition of a large quantity of etching solution presents safety hazards by the high temperature the decomposing etching solution can attain and the high concentration of oxygen evolved from the decomposing etching solution.

Alderuccio et al and Elias et al teach that the etch rate is of primary importance in the manufacture of etched, printed circuits. It is a well-known rule of thumb that the rates of chemical reactions double for each increase of 10° C. In preferring the use of etching temperatures of 50° C. to 60° C., both Alderuccio et al and Elias et al rely on the use of elevated temperatures to obtain the desired rapid etch rates.

However, it is also well known that these high temperatures also promote the decomposition of hydrogen peroxide, thus depleting the etch bath of the necessary oxidant, and so reducing the etch rate with time. In doing so, both Alderuccio et al and Elias et al sacrifice uniform etch rates over an extended time for a short-term improvement in etch rate. While the increased etch rate may be maintained by adding additional hydrogen peroxide to the bath, this adds to the overall cost of etching the printed circuits because of the lower chemical efficiency of the etch bath. The additional hydrogen peroxide, unless added as a concentrate, dilutes the etch bath and thereby tends to further reduce the etch rate.

In accordance with the present invention, a composition is provided suitable for the etching of laminated, printed circuit boards in the presence of chloride ions at a uniform and rapid etch rate. This composition comprises: an aqueous solution of sulfuric acid, hydrogen peroxide, a thiosulfate salt; and a stabilizer system including an aminomethylenephosphonic acid and an unsaturated organic hydroxy compound with an abstractable hydrogen, such as phenol or allyl alcohol.

The sulfuric acid concentration of the composition is not critical and will drop as copper is dissolved but is preferred to be within the range of 2% to 20% sulfuric acid, preferably 5% to 12% sulfuric acid. Similarly, the concentration of the hydrogen peroxide may vary over a wide range, but for a more uniform and rapid etch rate it is preferred to maintain from 2% to 10% hydrogen peroxide in the composition, more preferably 2% to 5%. The thiosulfate ion may be present in any effective range to overcome the depressing effect of chloride ion, preferably 0.05% to 0.1%. As explained below, it is preferable if the thiosulfate is added as magnesium or ammonium thiosulfate to maintain the composition substantially free of sodium and potassium ions. The aminomethylenephosphonic acid is preferably present in the range of 0.1% to 0.4%. The aminomethylenephosphonic acid is preferably present as a mixture of amino tris(methylenephosphonic acid) and ethylenediamine tetra(methylene-phosphonic acid). Most preferably, the mixture contains about 0.06% to 0.08% amino tris(methylenephosphonic acid) and about 0.036% to 0.048% ethylenediamine tetra(methylenephosphonic acid). The unsaturated organic hydroxy compound is preferably phenol and preferably it is present in the range of 0.005% to 0.05%. The phenol may be added either as phenol or a combined form, such as phenyl acid phosphate.

In the use of this composition the laminated, printed circuit boards are either immersed in the composition or subjected to a spray of the composition. Although higher or lower temperatures can be used, the full benefit of the present invention is best obtained by operation at a temperature of 35° C. to 45° C., preferably about 38° C. to 42° C.

When the copper concentration of the solution increases sufficiently, copper sulfate pentahydrate may be crystallized by cooling a side stream. However, if sodium or potassium thiosulfate is added, eventually the corresponding sulfate will also crystallize and contaminate the copper sulfate.

However, if magnesium thiosulfate is used and the sodium and potassium in the etch solution are minimized, then the magnesium may be conveniently removed from solution, for example, by crystallizing as magnesium orthophosphate or precipitating as a fatty acid salt, such as magnesium stearate or magnesium laurate. If ammonium thiosulfate is used it will not present the problem because of its great solubility, and even if crystals form with the copper sulfate pentahydrate they may be decomposed by heating.

Other preferred embodiments of the present invention will be evident to one skilled in the art from the following non-limiting examples:

EXAMPLE 1

A concentrate was prepared containing 32.5% hydrogen peroxide, 0.68% amino tris(ethylenediaminephosphonic acid), 0.4% ethylenediamine tetra(methylenephosphonic acid), 0.2% phenol, and 0.3% phenyl acid phosphate.

An etch solution was prepared from this concentrate containing 45 mg/l chloride ion, 3.9% hydrogen peroxide, 12% sulfuric acid, 3.5 g/l copper ion, 0.08% amino tris(methylenephosphonic acid), 0.05% ethylenediamine tetra(methylenephosphonic acid), 0.04% total phenol, and 0.1% sodium thiosulfate. Printed circuit boards, 2.5×5.0 cm, were etched at 43° C. in a spray etcher and the etch time and hydrogen peroxide utilization in grams hydrogen peroxide per gram of copper etched (g $H_2O_2$/g Cu) were observed. The results are presented in Table I.

EXAMPLE 2

Example 1 was repeated except the solution contained 3.3% hydrogen peroxide and 10.2% sulfuric acid. Etching was continued until the solution contained 28 mg/l copper. The etch time was then determined; the overall hydrogen peroxide utilization was determined and the results are presented in Table I.

EXAMPLE 3

Example 2 was repeated with essentially no sodium in the solution except for solution concentrations of 3.8% hydrogen peroxide, 12.1% sulfuric acid, and the sodium thiosulfate was replaced with 1 g/l ammonium thiosulfate. The etch time was determined when 9.8 g/l copper had accumulated and the results are reported in Table I as Example 3A.

The etch rate was then determined at 54° C. and reported as Example 3B.

EXAMPLE 4

Example 3 was repeated except for solution concentrations of 3.5% hydrogen peroxide, 10.6% sulfuric acid, and 1 g/l magnesium thiosulfate; the etch time was determined when 7.0 g/l copper had accumulated. The results are reported as Examples 4A (43° C.) and 4B (54° C.) in Table I.

EXAMPLE 5

Example 3 was repeated except for solution concentrations of 3.5% hydrogen peroxide, 10.8% sulfuric acid, and 1 g/l potassium thiosulfate; the etch time was determined when 7.0 g/l copper had accumulated. The results are reported in Table I as Examples 5A (43° C.) and 5B (54° C.).

EXAMPLE 6

Example 1 was repeated using a different batch of hydrogen peroxide concentrate. The etch solution contained 3.3% hydrogen peroxide, 10.2% sulfuric acid, 3.5% g/l copper, and 1 g/l sodium thiosulfate. Etch time was determined when the solution contained 13 g/l copper. Results are reported in Table I as Example 6.

EXAMPLE 7

Example 6 was repeated. The etch solution prepared using this new hydrogen peroxide concentrate contained 3.4% hydrogen peroxide, 10.4% sulfuric acid, 0.04% ethylenediamine tetra(methylenephosphonic acid), 0.07% amino tris(methylenephosphonic acid), and 0.04% total phenol. To this was added 1 g/l sodium thiosulfate and sufficient copper sulfate pentahydrate to provide 3.5 g/l copper in solution. After etching sufficient printed circuits to accumulate 14 g/l copper, the etch time was determined and the results reported as Example 7 in Table I.

EXAMPLE 8

(Comparative Example)

An etch solution was prepared according to U.S. Pat. No. 4,130,455. The solution contained 9.1% hydrogen peroxide, 15.8 g/l sodium phenol sulfonate, 1 g/l sodium thiosulfate, and 3.5 g/l copper. The etch rate was determined at 53° C. after 28 g/l copper had accumulated in solution. The results are reported as Example 8A in Table I. In addition, Example 8B contained 0.2% phenol.

From the above examples, it can be seen that satisfactory etch times of 1 minute or less can be obtained by this invention using 3% to 4% hydrogen peroxide at 43° C. rather than the 9% hydrogen peroxide at 54° C. required by the prior art.

TABLE I

Performance of Printed Circuit Etchants in the Presence of 45 mg/l Chloride

| Expl. No. | $H_2O_2$ % | $H_2SO_4$ % | Temp. °C. | Etch Time Min. | g/l Cu | g $H_2O_2$/ g Cu |
|---|---|---|---|---|---|---|
| 1 | 3.9 | 10.5 | 43 | 1.3 | 3.5 | 1.8 |
| 2 | 3.3 | 10.2 | 43 | 2.1 | 28.0 | 2.3 |
| 3A | 3.8 | 12.1 | 43 | 1.8 | 9.8 | 3.0 |
| 3B | 3.8 | 12.1 | 54 | 1.0 | — | — |
| 4A | 3.5 | 10.6 | 43 | 2.0 | 7.0 | 3.4 |
| 4B | 3.5 | 10.6 | 54 | 1.2 | — | — |
| 5A | 3.5 | 10.8 | 43 | 1.9 | 7.0 | 2.3 |
| 5B | 3.5 | 10.8 | 54 | 1.1 | — | — |
| 6 | 3.3 | 10.2 | 43 | 1.3 | 13.0 | 0.3 |
| 7 | 3.4 | 10.4 | 43 | 0.5 | 14.0 | 1.3 |
| 8A* | 9.1 | 15.8 | 52 | 0.6 | 28.0 | 3.7 |
| 8B | 9.9 | 16.0 | 54 | 0.5 | 7.0 | 7.2 |

*Comparative Example

What is claimed is:

1. An aqueous composition suitable for etching printed circuits even in the presence of more than 3 milligrams per liter of chloride ion comprising 2% to 20% sulfuric acid, 2% to 10% hydrogen peroxide, 0.1% to 0.4% of an aminomethylenephosphonic acid, 0.5% to 0.1% thiosulfate ion supplied as a thiosulfate salt, and 0.005% to 0.05% of an unsaturated organic hydroxy compound.

2. The composition of claim 1 containing 5% to 12% sulfuric acid, 2% to 5% hydrogen peroxide, the thiosulfate salt is selected from the group consisting of alkali metal thiosulfates, alkaline earth thiosulfates and ammonium thiosulfates, and the unsaturated organic hydroxy compound is phenol.

3. The composition of claim 1 or 2 wherein the aminomethylenephosphonic acid is selected from the group consisting of amino tris(methylenephosphonic acid), ethylenediamine tetra(methylenephosphonic acid), and mixtures of the two.

4. The composition of claim 3 containing as the aminomethylenephosphonic acid 0.06% to 0.08% amino tris(methylenephosphonic acid), and 0.036% to 0.048% ethylenediamine tetra(methylenephosphonic acid).

5. In the process of etching printed circuits with 2% to 20% sulfuric acid etchant using as the oxidant 2% to 10% hydrogen peroxide and 0.05% to 0.1% thiosulfate ion, and 0.005% to 0.5% of an unsaturated hydroxy compound, the improvement comprising the presence in the etchant of 0.01% to 0.4% of an aminomethylenephosphonic acid and maintaining the temperature of the etchant at 35° C. to 45° C.

6. The process of claim 5 wherein the aminomethylenephosphonic acid is selected from the group consisting of amino tris(methylenephosphonic acid), ethylenediamine tetra(methylenephosphonic acid), and mixtures of the two.

7. The process of claim 6 wherein the unsaturated hydroxy compound is phenol.

* * * * *

UNITED STATES PATENT AND TRADEMARK OFFICE
CERTIFICATE OF CORRECTION

PATENT NO. : 4,401,509

DATED : August 30, 1983

INVENTOR(S) : Richard Schellinger, Jr.

It is certified that error appears in the above-identified patent and that said Letters Patent are hereby corrected as shown below:

Column 3, line 19, "tetra(methylene-phosphonic acid" should read --tetra(methylenephosphonic acid--; column 5, line 33, "0.5%" should read --0.05%--; column 6, line 22, "0.5%" should read --0.05%--; column 6, line 24, "0.01%" should read --0.1%--.

Signed and Sealed this

Twenty-ninth Day of January 1985

[SEAL]

Attest:

DONALD J. QUIGG

Attesting Officer    Acting Commissioner of Patents and Trademarks